United States Patent [19]
Licata et al.

[11] Patent Number: 5,726,498
[45] Date of Patent: Mar. 10, 1998

[54] WIRE SHAPE CONFERRING REDUCED CROSSTALK AND FORMATION METHODS

[75] Inventors: Thomas John Licata; Jack Allan Mandelman, both of Dutchess County, N.Y.

[73] Assignee: International Business Machines Corporation, Armonk, N.Y.

[21] Appl. No.: 451,873

[22] Filed: May 26, 1995

[51] Int. Cl.[6] .................. H01L 23/48; H01L 23/52; H01L 29/40
[52] U.S. Cl. .................. 257/773; 257/758; 257/774; 257/775
[58] Field of Search .................. 257/775, 774, 257/758, 773

[56] References Cited

U.S. PATENT DOCUMENTS

| | | | |
|---|---|---|---|
| 4,076,575 | 2/1978 | Chang | 156/656.1 |
| 4,415,606 | 11/1983 | Cynkar et al. | 432/194 |
| 4,495,511 | 1/1985 | Yoder | 257/775 |
| 4,582,563 | 4/1986 | Hazuki et al. | 257/774 |
| 4,728,627 | 3/1988 | Mase et al. | 257/758 |
| 4,914,056 | 4/1990 | Okumura | 257/773 |
| 4,933,303 | 6/1990 | Mo | 257/774 |
| 5,001,541 | 3/1991 | Virkus et al. | 257/775 |
| 5,129,132 | 7/1992 | Zdeblick et al. | 437/194 |
| 5,198,695 | 3/1993 | Hanes et al. | 257/773 |
| 5,470,790 | 11/1995 | Myers et al. | 257/774 |
| 5,471,095 | 11/1995 | Kaminaga et al. | 257/775 |

FOREIGN PATENT DOCUMENTS

| | | | |
|---|---|---|---|
| 1-67941 | 3/1989 | Japan | 257/775 |
| 2-1917 | 1/1990 | Japan | 257/775 |
| 2-178951 | 7/1990 | Japan | 257/775 |
| 2-237138 | 9/1990 | Japan | 257/775 |

OTHER PUBLICATIONS

P.A. Brennan et al., "Integrated Circuit with Increased Air Dielectric" IBM Technical Disclosure Bulletin vol. 20, No.3, Aug. 1977.

J.E. Cronin et al., "Method for Making Micron–Size Cylindrical Lines" IBm Technical Disclosure Bulletin vol. 34, No. 1, Jun. 1991.

J. Ahn and N. Helgeson, "Method of Tapering TaAuTa Conductor Section for Improved Magnetic Bubble Device Performance" IBM Technical Disclosure Bulletin vol. 21, No. 10, Mar. 1979.

Takayasu Sakurai, "Closed–Form Expressions for Interconnection Delay, Coupling, and Crosstalk in VLSI's" *IEEE Transactions on Electron Devices*, vol. 40, No. 1 Jan. 1993.

Lynn Allen and R. Rickard, "Tapered Aluminum Interconnect Etch" *J. Vac. Sci. Technol. A.*, vol. 12, No. 4, Jul./Aug. 1994.

Maissel et al., "Handbook of Thin Film Technology" pp. 7–35–7–45, 1970.

Wayne M. Moreau, "Semiconductor Lithography" 1988 Plenum Press, NY.

Paraszczak et al., "High Performance Dielectrics and Processes for ULSI Interconnection Technologies" *Proc. Int'l Electron Device Meeting* 1993, pp. 261–264.

"Method For Making Micron–Size Cylindrical Lines," *IBM Technical Disclosure Bulletin*, vol. 34, No. 1, Jun. 1991, pp. 308–309.

"Taper Etching Method of Aluminum Film," *IBM Technical Disclosure Bulletin*, vol. 37, No. 5, May 1994, pp. 207–208.

"Slope Formation and Its Angle Control on Etching of Aluminum Gate Film," *IBM Technical Disclosure Bulletin*, vol. 37, No. 5, May 1994, pp. 329–331.

*Primary Examiner*—Mahshid D. Saadat
*Assistant Examiner*—T. M. Arroyo
*Attorney, Agent, or Firm*—Whitham, Curtis, Whitham & McGinn

[57] ABSTRACT

Capacitive coupling, and attendant cross-talk, is reduced by increasing the distance between wire surfaces in integrated circuit applications. This is done by changing wire shape from the conventional rectangular cross-section. A cross-section which consists of a rectangular portion and a shaped, triangular portion is created, having the effect of increasing the effective distance between adjacent conductors. Cross-sectional area of wires is maintained and thus the current carrying capacity is maintained. The wire shapes may be produced using several alternate methods.

6 Claims, 9 Drawing Sheets

5,726,498

WIRE SHAPE CONFERRING REDUCED CROSSTALK AND FORMATION METHODS

BACKGROUND OF THE INVENTION

1. Field of the Invention

The present invention generally relates to wiring in integrated circuits (ICs) and, more particularly, to wire shapes which minimize capacitive coupling while maintaining current carrying capacity.

2. Background Description

In a typical integrated circuit device, conductive wires are used to provide electrical contact among devices and chips, and between chips and the outside world. These wires can be fabricated from metal, metal compounds such as silicides or nitrides, or polysilicon depending on the application. For cost and performance reasons, the trend has been to include more conductors of reduced dimensions on a given chip. This is achieved within a wiring plane by reducing the width of the conductors and of the intervening dielectric isolation regions. Additionally, multiple wiring levels can be fabricated sequentially and interconnected in a discretionary manner using short range vertical interconnects (studs).

It is generally desirable for conductors to not limit the speed of the transmitted signals and to not degrade signals in adjacent conductors due to capacitive coupling. However, signal speed is reduced in wires and signals are degraded in neighboring conductors because of capacitive coupling. The reduction in signal speed is in proportion to the wire resistance and capacitance (i.e., RC time constant). The wire resistance is determined by the intrinsic resistivity of wire material and by the wire dimensions, which can be varied within limits set by design and process limitations. Thus, wire resistance is a relatively fixed value for a given design and technology.

Unfortunately, as wires are positioned in close proximity to each other, the wire coupling capacitance increases. The extended field surrounding a current carrying wire intersects neighboring wires, thereby producing an undesirable current in the neighboring wire and weakening the original signal. This effect is known as capacitive coupling or crosstalk, and can be referred to as interlevel or intralevel, depending on whether the wires are located on the same wiring plane.

Accordingly, methods to increase device speed through reduced capacitive coupling have been developed and implemented. In one technique, the dielectric film used to isolate the wires/interlayer dielectric or ILD) can be replaced by a film having a lower dielectric constant. The standard $SiO_2$ dielectric film has a dielectric constant of about 3.9. Paraszczak et al., *Proc. Int'l Electron Device Meeting* 1993, pp.261-264 for instance, have shown that a fluoropolymer ILD can yield an effective dielectric constant of 2.6, resulting in a large increase in system performance. In another approach, reduced crosstalk can be obtained by optimizing the cross-sectional dimensions of wires having rectangular cross sections. For example, Sakurai et al., *IEEE Trans. Electron Dev.* Vol. 40, No. 1, January 1993, have generated expressions for the interlevel coupling capacitance and crosstalk voltage, which were then used to identify the optimum linewidth corresponding to minimum RC delay for a given pitch and conductance.

Despite these efforts, crosstalk between conductors remains a principle limitation to IC speed and is expected to become increasingly severe for future products fabricated at sub half-micron minimum dimensions.

SUMMARY OF THE INVENTION

It is therefore an object of the present invention to provide a wire shape particularly useful in integrated circuit fabrication and having an increased cross sectional area compared to current practice while lowering capacitive coupling to adjacent conductors.

It is another object of the present invention to provide metal wires for integrated circuits in which current carrying capacity is maintained while capacitative coupling is reduced.

According to the invention, metal wires are prepared such that the cross section is not rectangular. Metal wires of the present invention have cross sections in a shape which has been optimized to contain more metal than a standard rectangular wire for the same capacitive coupling. The inventive process includes determining optimum wire shapes and then fabricating by depositing metal on an underlying shaped dielectric and using chemical mechanical planarization (in a damascene process) or by depositing metal on a flat surface and producing tapered walls by chemical and/or physical etching.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
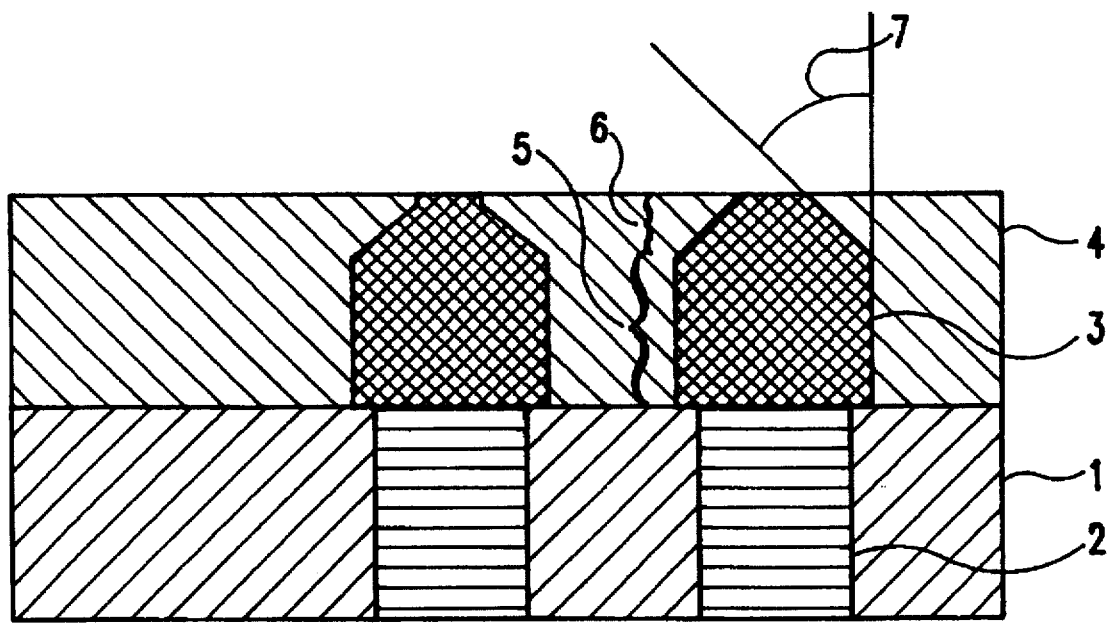
FIG. 1 is a cross sectional view of a substrate and embedded studs with optimized overlying wire shape formed using reactive ion etching according to first, second, third or fourth methods of the invention.

Referring now to the drawings, and more particularly to FIG. 1, there is shown a substrate 1 having tungsten studs 2. Wires 3 having optimized shape over the tungsten studs 2 are formed, then encapsulated in oxide layer 4 over the substrate 1. Wires 3 have a square lower cross-section 5 and trapezoidal upper cross-section 6. Alternatively, this upper section 6 may also have a triangular or semicircular shape.

Figure 2:
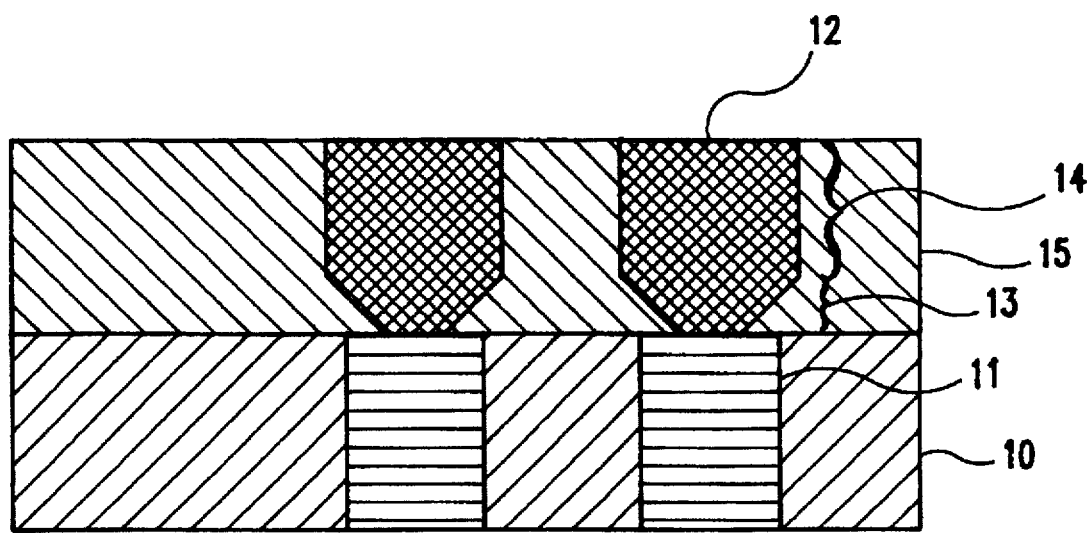
FIG. 2 is a cross sectional view of a substrate and embedded studs showing optimized wire shape formed using damascene patterning according to a fifth method of the invention.

Such wires can be formed by several methods, without or with using an additional mask. For instance, in FIG. 2, wiring produced using a damascene integration scheme is illustrated. A substrate 10 with tungsten studs 11 is provided. The wires 12 are formed in an optimized shape with a lower cross section 13 having a trapezoidal shape and an upper cross section 14 having a rectangular shape. The wires 12 are separated by silicon dioxide 15.

In conventional wiring, the capacitive coupling of such wires is dominated by the adjacent faces of the rectangular regions. However, since such coupling capacitance decreases superlinearly with distance, the upper prism of such a wire contributes little to capacitance, but can dramatically increase wire volume.

As compared with conventional wiring at a given pitch, this invention reduces crosstalk for a given conductance or can be used to provide higher conductance for the same amount of crosstalk. Similarly, this invention reduces interlevel capacitive coupling. There is an additional benefit to using this technique with overlying studs, in that the intersection area between the stud and wire is enhanced.

Simulations of line-to-line and interlevel capacitance on an aluminum wire sidewall taper have shown reduction in crosstalk. Sidewall taper angle is measured based on the angle the sidewall makes with a vertical line, as shown by angle 7 of FIG. 1. Laplace's differential equation, $$\nabla^2 \phi = \rho/\epsilon,$$

where $\phi$ is the electric potential, $\rho$ is the volume density of all charges in the field, and $\epsilon$ is the permitivity, was solved for electric potential using the finite-element method. Holding the wire cross sectional area, resistance per unit length, width and space constant, the taper angle was varied to minimize the capacitance components. This case was chosen since it is a set of constraints commonly encountered for submicron scale integrated circuits.

Figure 3:
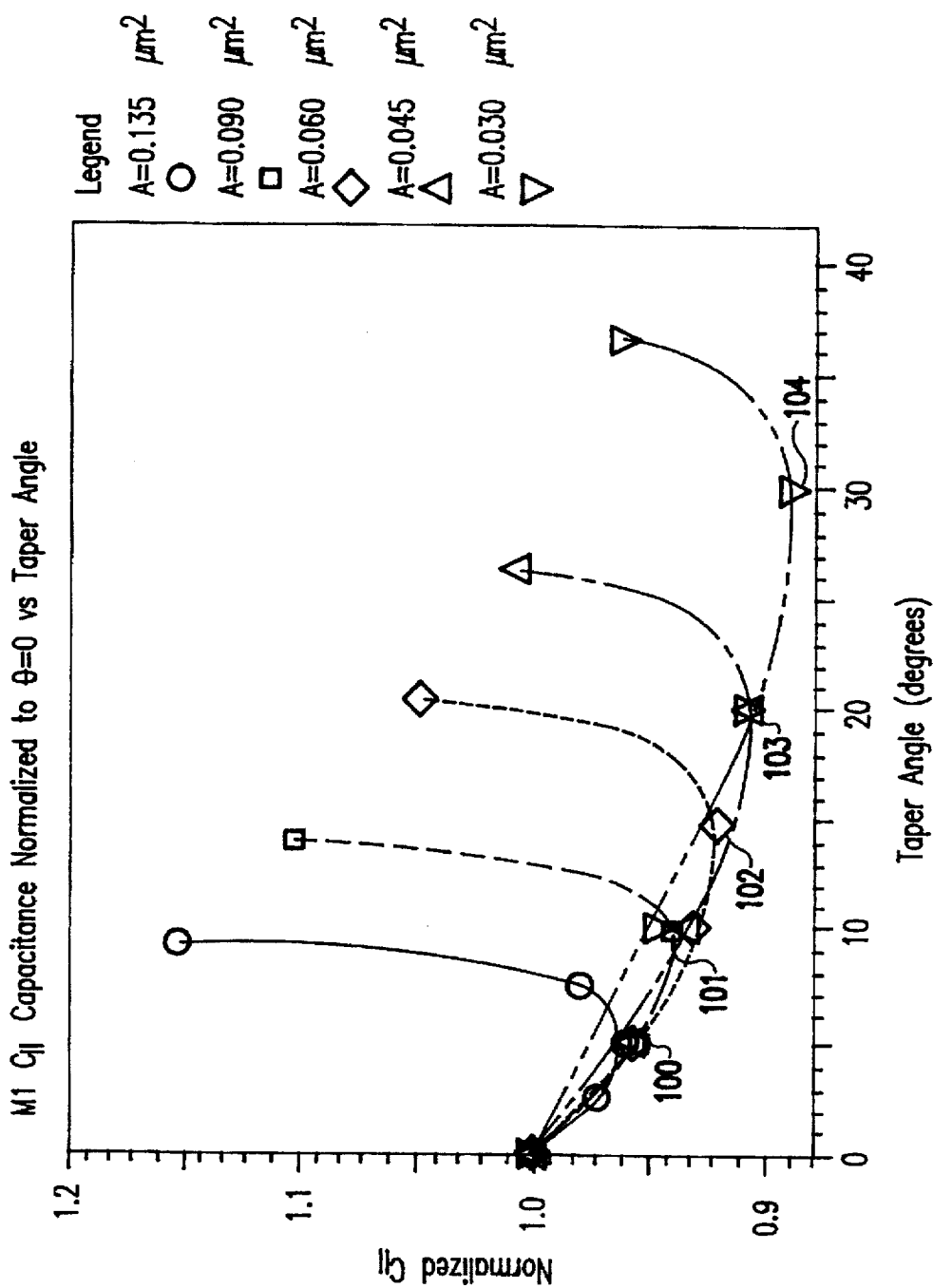
FIG. 3 is a graph of a normalized modeled line-to-line or interlevel capacitance versus taper angle of wires having varying taper angle.

FIG. 3 shows the modeled line to line capacitance, normalized to a rectangular wire cross section of equal area as a function of the taper angle for various cross sectional areas. Distinct minima occur at points 100, 101, 102, 103, and 104, showing the optimum taper angles. It will be observed by a person of ordinary skill in the art that the minima represent lower coupling capacitances for the tapered wires than is the case for conventional rectangular wires of the same cross sectional area. Optimum taper angles increase as area decreases. The percent reduction in capacitance increases with decreasing cross sectional area (wire height). For cross sectional area which is typical for ultra large scale integrated circuits (ULSI), on the order of 0.030 $\mu m^2$, a reduction in line-to-line capacitance in excess of 10% is realized.

Figure 4:
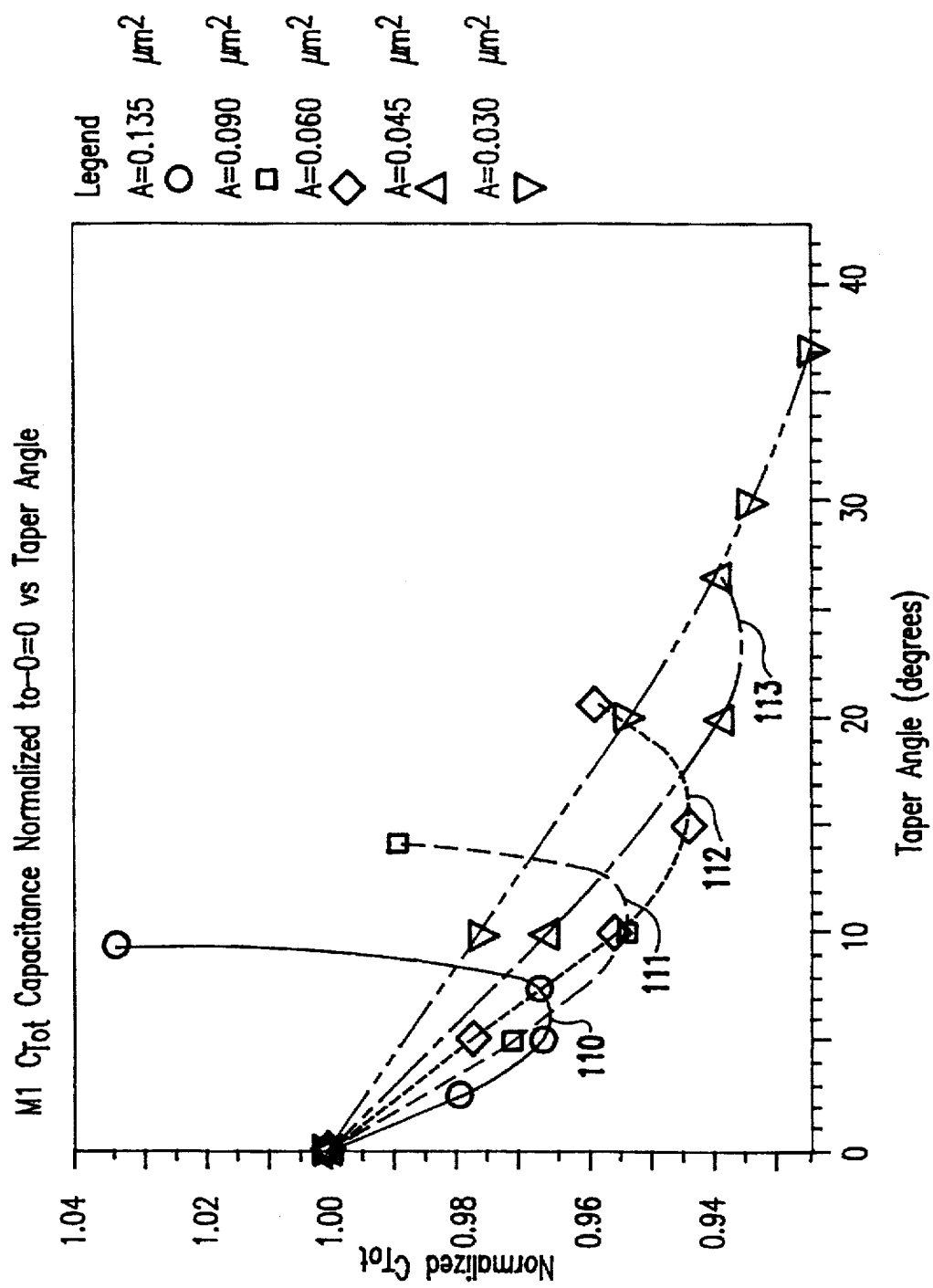
FIG. 4 is a graph of normalized total (intralevel and interlevel) capacitance for an exemplary integrated circuit versus taper angle of wires having varying taper angles.

FIG. 4 shows similar curves for normalized total capacitance versus taper angle. Minima occur at points 110, 111, 112, and 113, showing optimum taper angle for reduction of total capacitance. The total capacitance consists of the sum of the line-to-line capacitance and the interlevel capacitances. It has been found that significant reduction in total capacitance for ULSI generation chip wiring can also be obtained.

Figure 5:
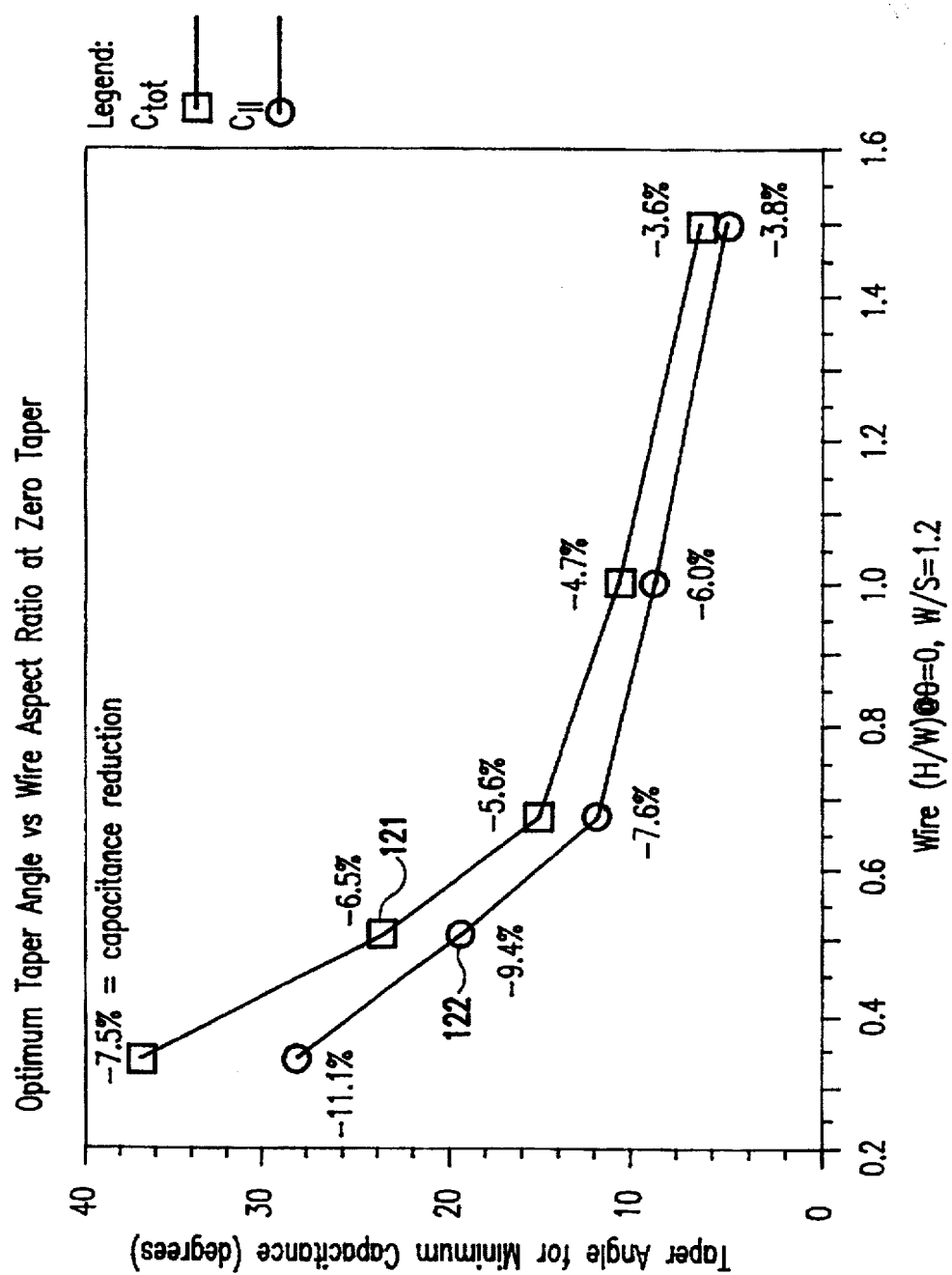
FIG. 5 is a graph of optimum taper angle versus wire aspect ratio at zero taper.

FIG. 5 summarizes the modeling results by showing the reduction in line-to-line capacitance and total capacitance for optimum taper angles as a function of aspect ratio (height to width ratio) and optimum taper angle as measured by the minima of FIGS. 3 and 4. For example, for a wire having a height to width ratio of 0.45, a 6.5% reduction in total capacitance is achieved at a taper angle of approximately 24°, point 121, and 9.4% reduction in line-to-line capacitance is achieved at a taper angle of approximately of 20°, point 122.

Note that these reductions in capacitance are large and valuable. Other methods for obtaining the same gains such as replacing the interlayer dielectric (ILD) are very costly since a material change requires reoptimization of the ILD deposition and patterning processes and metal. On the other hand, it is clear that the present invention can be combined with lower dielectric constant materials for even further gains over what is currently practiced.

Figure 6A:
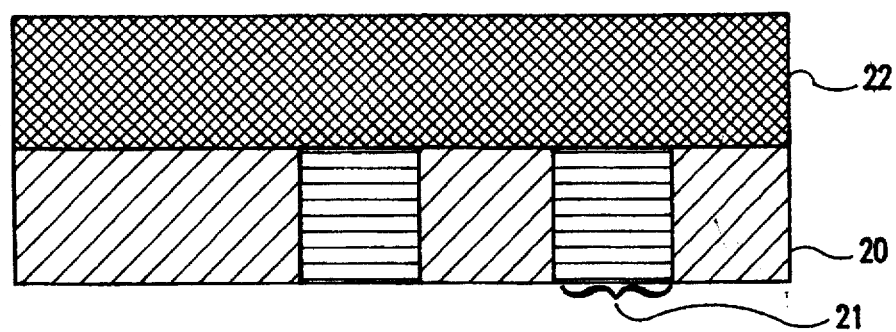
FIGS. 6A to 6D are cross sectional views of a substrate and embedded studs illustrating the first method of the invention using reactive ion etching.
Figure 6B:
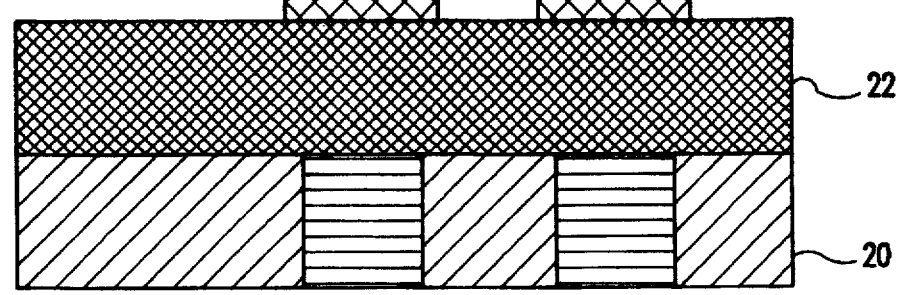
Figure 6C:
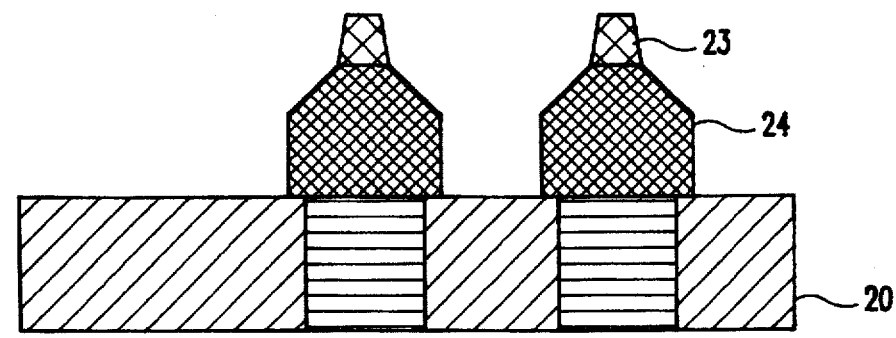
Figure 6D:
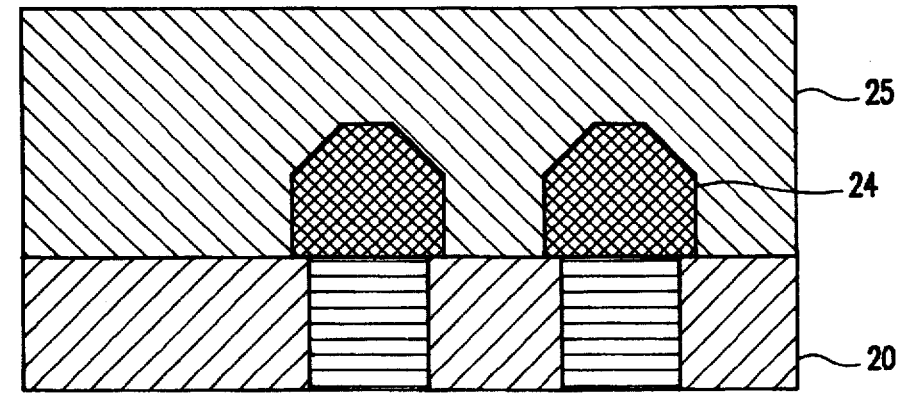

In FIGS. 6A to 6D, a first method of the present invention is illustrated using an anisotropic etch, preferably a reactive ion etch (RIE). In FIG. 6A, an oxide 20 with embedded studs 21 is shown first covered with metal 22. Then, a photoresist mask 23 which has been patterned is added to the structure in FIG. 6B. Next, in FIG. 6C a tapered wire 24 is created by etching while eroding mask 23. Finally, after removing mask 23, another oxide layer 25 is deposited over the wire 24 in FIG. 6D.

Figure 7A:
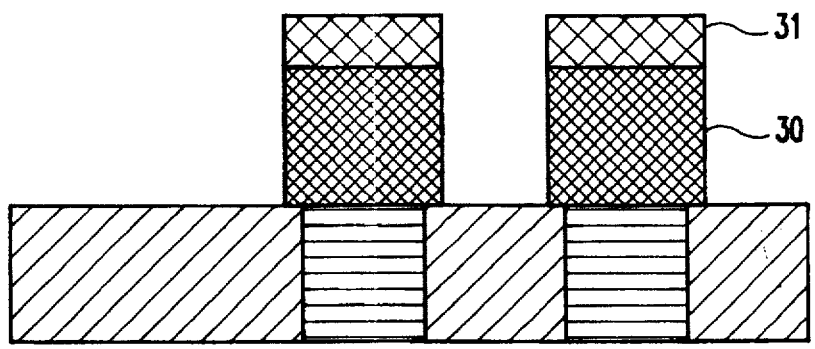
FIGS. 7A and 7B are cross sectional views of a substrate and embedded studs illustrating the second method of the present invention in which shaping of the metal is accomplished by sputtering during deposition of the overlying dielectric.
Figure 7B:
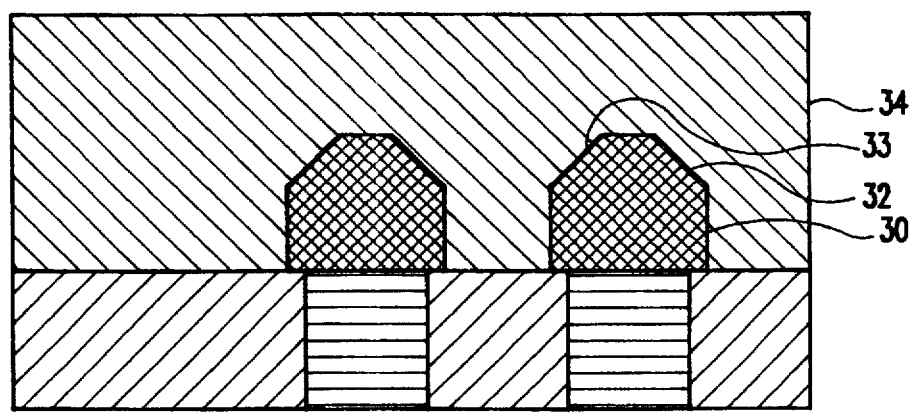

In FIGS. 7A and 7B, a second method of the invention using an anisotropic etch such as a reactive ion etch (RIE) is illustrated. As shown in FIG. 7A, a rectangular metal wire 30 has first been formed with a mask 31 that resists etching. Then, as shown in FIG. 7B, removal of the mask 31 and tapering of the metal wire 30 on its sides 32, 33 occurs during deposition of oxide 34, using a technique that has a large sputter component.

Figure 8A:
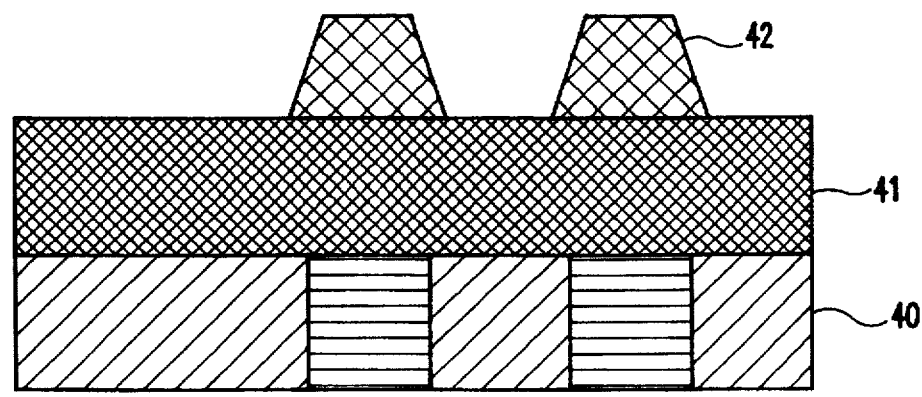
FIGS. 8A and 8B are cross sectional views illustrating the third method of the present invention using reactive ion etching.
Figure 8B:
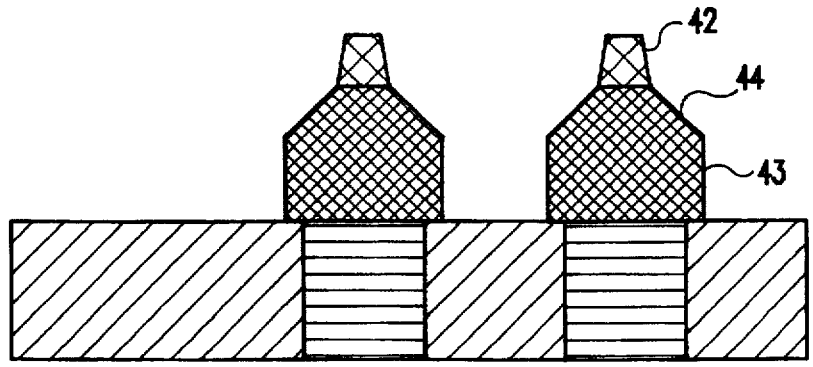

In FIGS. 8A and 8B, a third method of the invention is shown where a graded or tapered mask is used during a directional etch. First, as is shown in FIG. 8A, prepared oxide 40 with a layer of metal 41 having a tapered mask 42. Next, during a RIE, the tapered mask 42 is eroded forming a wire 43 with tapered edges 44. This creates a wire shape similar to the mask 42, as is shown in FIG. 8B. Finally, the tapered mask 42 would then be removed entirely.

Figure 9A:
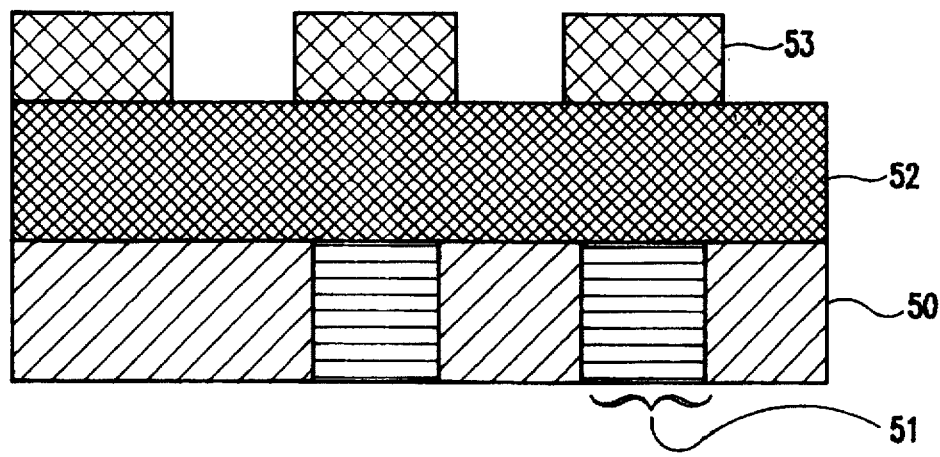
FIGS. 9A to 9C are cross sectional views illustrating the fourth method of the present invention using reactive ion etching.
Figure 9B:
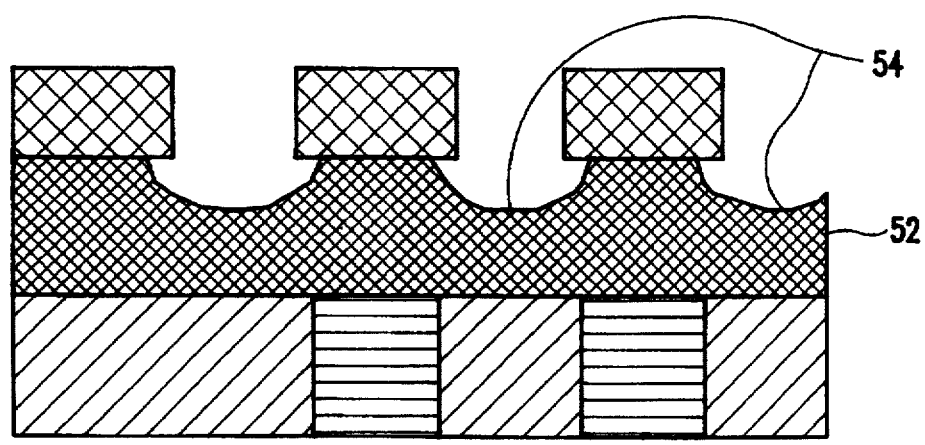
Figure 9C:
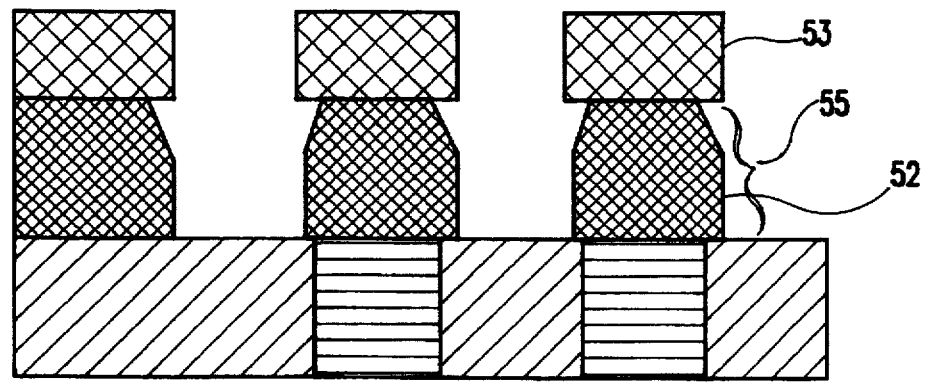

In FIGS. 9A to 9C, the fourth method of the invention uses a two-step etch to define the tapered wires. In FIG. 9A, oxide layer 50 is provided over overlying studs 51. Metal 52 covers the oxide 50. A patterned photoresist mask 53 is first placed over the metal 52. As shown in FIG. 9B, the next step is to isotropically etch the metal 52 using RIE or a wet chemical etchant such that shallow trenches 54 with angled edges begin to form in the metal 52. Then the metal 52 is etched using directional RIE creating tapered edges 55 beneath the photoresist 53, as is shown in FIG. 9C. Lastly, the photoresist 53 would be removed using conventional methods.

Figure 10A:
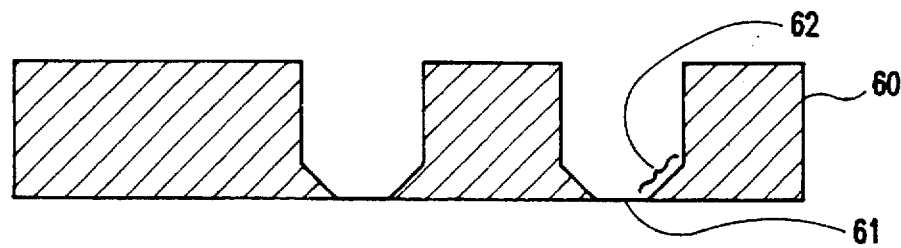
FIGS. 10A to 10C are cross-sectional views illustrating the fifth method of the present invention using damascene patterning.
Figure 10B:
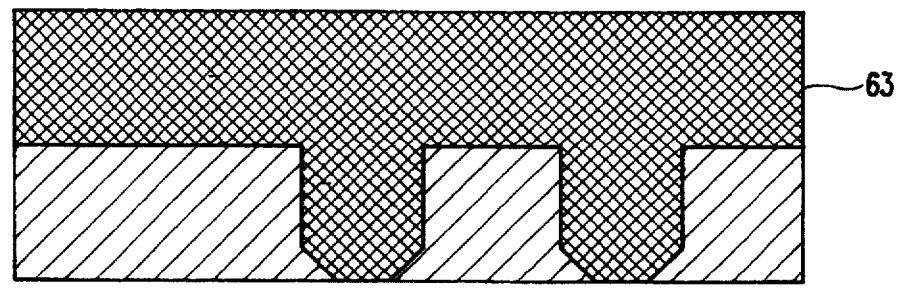
Figure 10C:
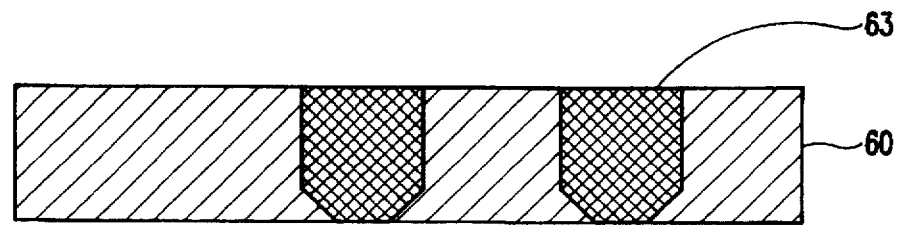

The fifth method of the invention is a damascene method as shown in FIGS. 10A to 10C. In FIG. 10A, an oxide 60 is provided with trenches 61. The trenches 61 have first been formed with tapered sides 62. Next, as shown in FIG. 10B, the oxide 60 is covered with metal 63 filling trenches 61. Finally, as shown in FIG. 10C, the metal 63 is polished back to the oxide layer 60 using a chemical-mechanical polish, leaving tapered metal wires in trenches 61.

For the reactive ion etch integration scheme, the mask and etch processes can be adjusted to yield fully beveled walls. With fully beveled walls, a cross section of wire would appear as simply a triangle, trapezoid, or semicircle. The wire would have no rectangular portion.

This invention is not limited to the use of aluminum as the wiring metal. Also other wire shapes may be obtained which may better reduce capacitive coupling for a particular application. Any wire shape where deviation from rectangular cross-section is employed to increase the distance between a wire surface and an adjacent conductor will reduce capacitive coupling while minimizing wire resistance.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A multilevel integrated circuit, comprising:

dielectric insulating material on a plurality of levels of said multilevel integrated circuit;

a plurality of conducting wires on said plurality of levels of said multilevel integrated circuit, at least a first and second conducting wire of said plurality of conducting wires being positioned on a first level of said plurality of levels, and at least a third conducting wire of said plurality of conducting wires being positioned on a second level of said plurality of levels, said dielectric insulating material being positioned between said first, second and third conducting wires; and means for reducing capacitive coupling between said first, second and third conducting wires without reducing the current carrying capacity of said first, second and third conducting wires comprising an identical, optimized cross-sectional shape for each of said first, second and third conducting wires which is non-rectangular and has tapered first and second side walls positioned between a top and a bottom, and wherein said tapered first and second side walls have a taper angle that is a function of a cross-sectional area for said identical, optimized cross-sectional shape where a total coupling capacitance between said first, second and third conducting wires is minimized compared to rectangular wires of the same cross-sectional area.

2. The multilevel integrated circuit of claim 1 wherein said identical, optimized cross-sectional shape is triangular.

3. The multilevel integrated circuit of claim 1 wherein said identical, optimized cross-sectional shape is trapezoidal.

4. The multilevel integrated circuit of claim 1 wherein said identical, optimized cross-sectional shape is pentagonal.

5. The multilevel integrated circuit of claim 1 wherein said identical, optimized cross-sectional shape is hexagonal.

6. The multilevel integrated circuit of claim 1 wherein said identical, optimized cross-sectional shape is polygonal.

* * * * *